(12) United States Patent
Tsai et al.

(10) Patent No.: US 11,876,150 B2
(45) Date of Patent: Jan. 16, 2024

(54) COMBINATION OF STRAIN MANAGEMENT LAYERS FOR LIGHT EMITTING ELEMENTS

(71) Applicant: GOOGLE LLC, Mountain View, CA (US)

(72) Inventors: Miao-Chan Tsai, Sunnyvale, CA (US); Benjamin Leung, Sunnyvale, CA (US); Richard Peter Schneider, Sunnyvale, CA (US)

(73) Assignee: GOOGLE LLC, Mountain View, CA (US)

( * ) Notice: Subject to any disclaimer, the term of this patent is extended or adjusted under 35 U.S.C. 154(b) by 248 days.

(21) Appl. No.: 17/324,437

(22) Filed: May 19, 2021

(65) Prior Publication Data

US 2021/0367106 A1 Nov. 25, 2021

Related U.S. Application Data

(60) Provisional application No. 63/027,049, filed on May 19, 2020.

(51) Int. Cl.
*H01L 33/32* (2010.01)
*H01L 33/04* (2010.01)

(52) U.S. Cl.
CPC .............. *H01L 33/32* (2013.01); *H01L 33/04* (2013.01)

(58) Field of Classification Search
CPC ................................ H01L 33/32; H01L 33/04
See application file for complete search history.

(56) References Cited

U.S. PATENT DOCUMENTS

| 9,252,329 | B2 | 2/2016 | Northrup et al. |
| 10,396,240 | B2 | 8/2019 | Yeh et al. |
| 10,586,829 | B2 | 3/2020 | Yoo |
| 2008/0054248 | A1* | 3/2008 | Chua ............... H01L 33/007 257/14 |
| 2013/0082237 | A1* | 4/2013 | Northrup ............ H01L 33/04 257/E33.035 |

(Continued)

OTHER PUBLICATIONS

PCT Application No. PCT/US2021/030699 International Search Report and Written Opinion, dated Aug. 12, 2021, 12 pages.

(Continued)

*Primary Examiner* — Mark W Tornow
(74) *Attorney, Agent, or Firm* — Brake Hughes Bellermann LLP (57) ABSTRACT

The disclosure describes various aspects of strain management layers for light emitting elements such as light-emitting diodes (LEDs). The present disclosure describes an LED structure formed on a substrate and having a strain management region supported on the substrate, and an active region configured to provide a light emission associated with the LED structure. The strain management region includes a first layer including a superlattice having a plurality of repeated first and second sublayers, and a second layer including a bulk layer. In an embodiment, at least one of the first and second sublayers and the bulk layer includes a composition of $In_xAl_yGa_{1-x-y}N$. A device having multiple LED structures and a method of making the LED structure are also described.

20 Claims, 9 Drawing Sheets

(56) References Cited

U.S. PATENT DOCUMENTS

| | | | |
|---|---|---|---|
| 2013/0341593 A1* | 12/2013 | Bergmann | H01L 33/06 257/13 |
| 2015/0207029 A1 | 7/2015 | Shur et al. | |
| 2016/0372631 A1 | 12/2016 | Hasegawa et al. | |
| 2019/0115495 A1 | 4/2019 | Bour et al. | |

OTHER PUBLICATIONS

PCT Application No. PCT/US2021/033094 International Search Report and Written Opinion, dated Aug. 24, 2021, 8 pages.

* cited by examiner

COMBINATION OF STRAIN MANAGEMENT LAYERS FOR LIGHT EMITTING ELEMENTS

CROSS-REFERENCE TO RELATED APPLICATIONS

This application benefits from and claims priority to U.S. provisional patent application Ser. No. 63/027,049, filed on May 19, 2020, the disclosure of which is incorporated herein by reference in its entirety.

BACKGROUND OF THE DISCLOSURE

Aspects of the present disclosure generally relate to light emitting elements, such as those used in various types of displays, and more specifically, to improved strain management layers in the structures of light emitting elements.

Some light-emitting diodes (LEDs), such as high efficiency Indium-Gallium-Nitride (InGaN) LEDs, require a layer structure underneath the active region (e.g., the region that performs light emission) that provides the type of material quality to form an active region with the performance levels needed for modern LED applications. This layer structure, which may include multiple layers, may generally be referred to as strain management layers or preparation (prep) layers. The strain management layers are usually used for providing suitable material characteristics for allowing the formation of an active region with the desired light emission characteristics, such as emission wavelength and efficiency. However, strain management layers, such as one or more Indium (In)-containing layers used with InGaN LEDs for example, can be prone to surface defects that lead to nonideal light emission performance from the active region deposited thereon.

Aspects of the present disclosure provide techniques and structures that improve the strain management layers and their overall effect on the performance in the light emitting elements.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

The present disclosure describes the application of a combination of strain management layers, such as a strained layer superlattice (SLS) and bulk In-containing layers, in light emitting devices such as LEDs. For example, the combination may enable thick layers to recover surface morphology, provide active region improvement, and/or enable the SLS to improve strain layer management and active region performance.

In an aspect of the disclosure, an LED structure formed on a substrate is described. The LED structure includes a strain management region supported on the substrate, and an active region configured to provide a light emission associated with the LED structure. The strain management region includes a first layer including a superlattice having a plurality of repeated first and second sublayers, and a second layer including a bulk layer. In an embodiment, at least one of the first and second sublayers and the bulk layer includes a composition of $In_xAl_yGa_{1-x-y}N$.

In another aspect of the disclosure, a light emitting device is described that includes a semiconductor template; and an array of light emitting structures supported on the semiconductor template. At least one of the light emitting structures of the array of light emitting structures includes an active region configured to provide a light emission associated with the at least one light emitting structure. The at least one light emitting structure also includes a strain management region including a first layer including a superlattice having a plurality of repeated first and second sublayers, and a second layer including a bulk layer. In an embodiment at least one of the first and second sublayers and the bulk layer includes a composition of $In_xAl_yGa_{1-x-y}N$

BRIEF DESCRIPTION OF THE DRAWINGS

The appended drawings illustrate only some implementation and are therefore not to be considered limiting of scope.

DETAILED DESCRIPTION

The detailed description set forth below in connection with the appended drawings or figures is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

There is a need for ever increasing numbers of light emitting structures or elements (e.g., pixels) in displays to provide better user experience and to enable new applications, but adding more of them becomes a challenge. To achieve ever smaller light emitting structures in order to increase both count and density has made the potential use of small LEDs (e.g., micro-LEDs or nano emitters) more attractive, but the few techniques for making small LEDs in large numbers, high densities, and capable of producing different colors (e.g., red, green, blue) are currently cumbersome, time consuming, costly, or result in structures with performance limitations. While more sophisticated display architectures, such as those for high density and light field displays, may benefit from the use of small LEDs, the requirements of such displays make the implementation of small LEDs difficult. Accordingly, new techniques and devices that allow for the monolithic integration of large numbers of small light emitting structures that generate different colors of light on a same substrate (e.g., a single integrated semiconductor device) are desirable.

The use of certain semiconductor processing techniques for making the light emitting structures, such as epitaxial growth and dry etch or selective area growth (SAG), for example, provide a promising approach for the monolithic integration of a large number of microLEDs on a single integrated semiconductor device. The quality of the material or materials grown on the semiconductor template for making the light emitting structures have a significant impact on the performance characteristics of the LEDs.

To this end, structural configurations that enable the formation of small light emitting structures with high quality active (e.g., emitting) regions are needed. For example, for quantum well (QW)-based LEDs, strategic inclusion of preparation layers can improve or enhance the morphology and/or strain characteristics of the active regions in the light emitting structures.

Two separate and distinct approaches are commonly used for strain management in LEDs. In one approach, multiple pairs of an In-containing layer and a non-Indium-containing layer form a strained layer superlattice (SLS) as a strain management mechanism. However, the SLS approach is hampered by the tendency for pit formation on the SLS surface prior to the formation of the active QW layer thereon. For example, when thin layers of InGaN—GaN pairs are stacked to form the SLS, the low temperature epitaxial growth processes required for the SLS formation tends to lead to pit formation. In an alternative approach, a bulk layer, such as a thick layer of InGaN, AlInN or AlInGaN, can be used for strain management between the semiconductor template and the active QW region. In either the SLS or bulk layer approach, In-containing layers are used, as the inclusion of indium has been empirically shown to provide an enhancement of the light emitting efficiency in LEDs. The In-content of the layers generally do not exceed that of the active QW region, in order to prevent light absorption in the In-containing SLS or bulk layers.

The present disclosure provides a combined application of both SLS and one or more bulk layers (such as a thick InGaN, AlInN or AlInGaN layer) as strain management layers in LEDs. Aspects presented herein use the combination of bulk layers and SLS to provide improved or optimal strain layer management and active region performance.

Figure 1:
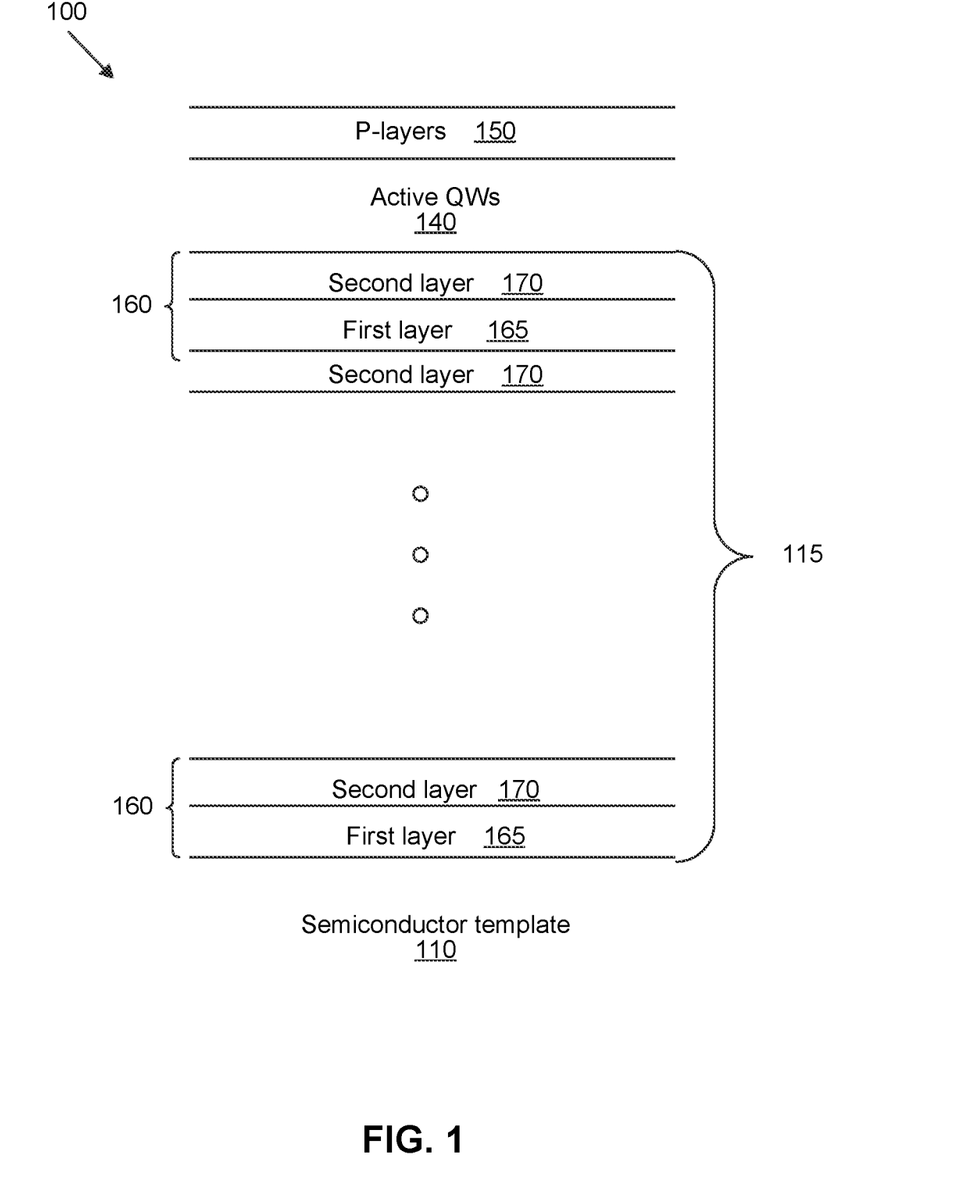
FIG. 1 illustrates an example of an LED structure that uses strained layer superlattice (SLS) strain management approach.

FIG. 1 shows a diagram illustrating an example of an LED structure 100, which uses the strained layer superlattice (SLS) strain management approach described above. LED structure 100 is formed on a semiconductor template 110. In some implementations, a technique such as epitaxial growth and dry etching or selective area growth (SAG) may be used to define the position, shape, and size of LED structure 100 on semiconductor template 110. In an example, semiconductor template 110 is formed of an n-type GaN template or an epitaxial layer formed on a semiconductor substrate.

As shown in FIG. 1, LED structure 100 includes a SLS 115 formed over semiconductor template 110. LED structure 100 also includes active quantum wells (QWs) 140, at which light emission from LED structure 100 is produced, and one or more p-layers 150, which enable electrical contact with LED structure 100. Light emission from QWs 140 may be an electromagnetic wave having a wavelength range in, for example, the visible spectrum. P-layers 150 may include, for example, p-doped layers and/or a contact layer. Various components of LED structure 100 are grown (e.g., epitaxially grown), deposited, or otherwise formed adjacent to one other in the exemplary configuration shown in FIG. 1.

In an example, SLS 115 includes one or more pairs 160 of a first layer 165 and a second layer 170. In some examples, SLS 115 includes tens of pairs 160 for a total thickness of 20 nanometers or greater (>20 nm) for SLS 115. In some examples, SLS 115 includes 20 to 60 or more pairs 160 of the first and second layers. First layer 165 includes, for example, InGaN, AlInN or AlInGaN. Second layer 170 includes, for instance, GaN. In an example, an optional layer structure (not shown) may be formed between semiconductor template 110 and SLS 115, or between SLS 115 and active QWs 140.

As discussed above, while the inclusion of SLS 115 may improve the strain characteristics of active QWs 140 of the LED structure 100, SLS 115 is prone to the formation of pits, leading to potential performance issues in the light emission from LED structure 100.

Figure 2:
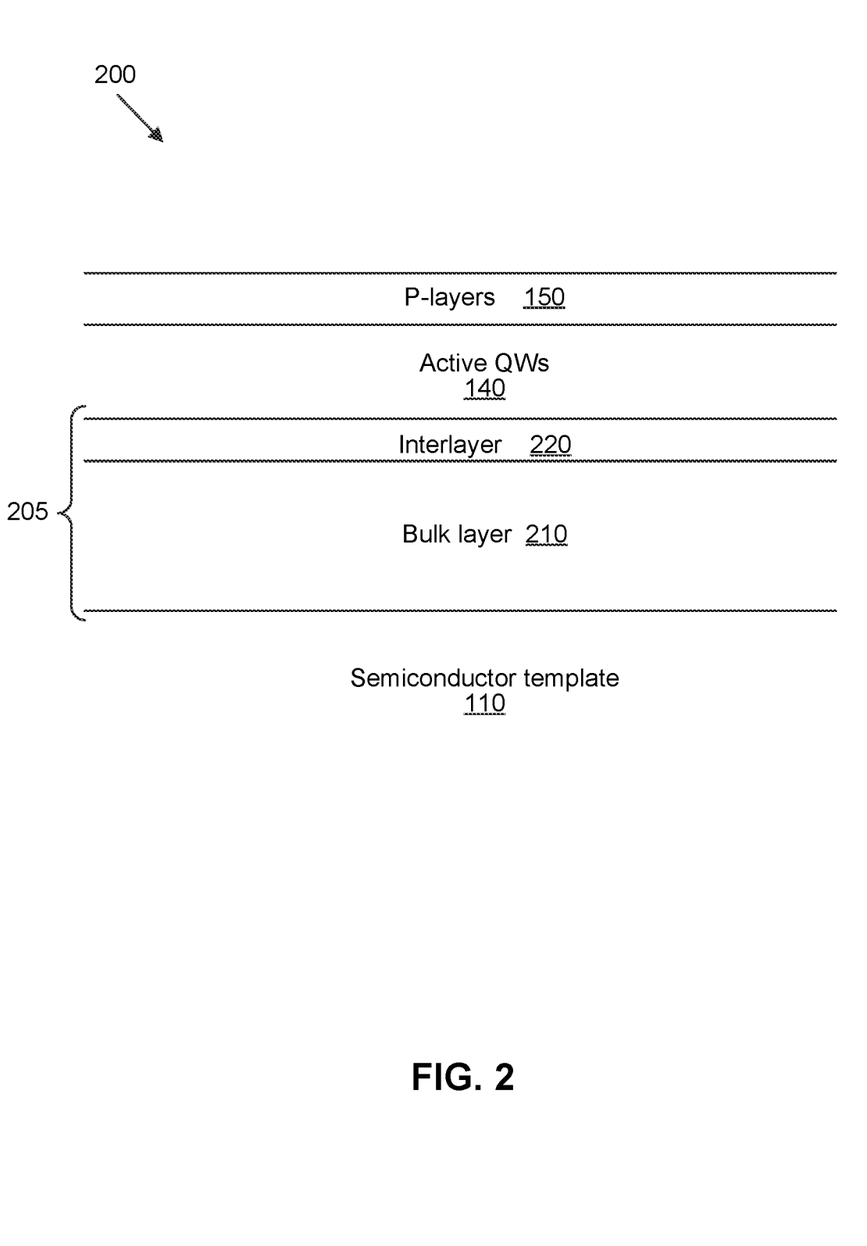
FIG. 2 illustrates an example of an LED structure that uses a thick In-containing layer preparation approach.

FIG. 2 illustrates an example of an LED structure 200 having a bulk layer as the strain management layer. Like, LED structure 100 shown in FIG. 1, LED structure 200 includes a combination of active QWs 140 and p-layers 150 formed on a semiconductor template 110. Instead of an SLS structure, LED structure 200 includes a strain management structure 205, including a bulk layer 210 and an interlayer 220, formed between active QWs 140 and semiconductor template 110. Bulk layer 210 is, for example, a thick layer including InGaN, AlInN or AlInGaN. In some cases, bulk layer 210 is 50 nm or greater in thickness. Interlayer 220 may be formed, for example, of GaN, AlGaN, or InGaN, configured for providing a suitable interface for the deposition of active QWs 140.

A solution proposed in this disclosure that may result in reduced pits for growing the active region (e.g., active QWs 140) in an LED includes a combination of aspects described in connection with LED structures 100 and 200 in FIGS. 1 and 2, respectively. Aspects presented herein provide a combination of a SLS and a bulk layer. A device may include one or more sets of the combination, e.g., 1-10 sets, or more than 10 sets. This solution may be suitable for microLEDs (e.g., LEDs with device pitch on the order of a few microns or smaller, made using etching or SAG techniques) but may also be applicable to larger LEDs.

Figure 3:
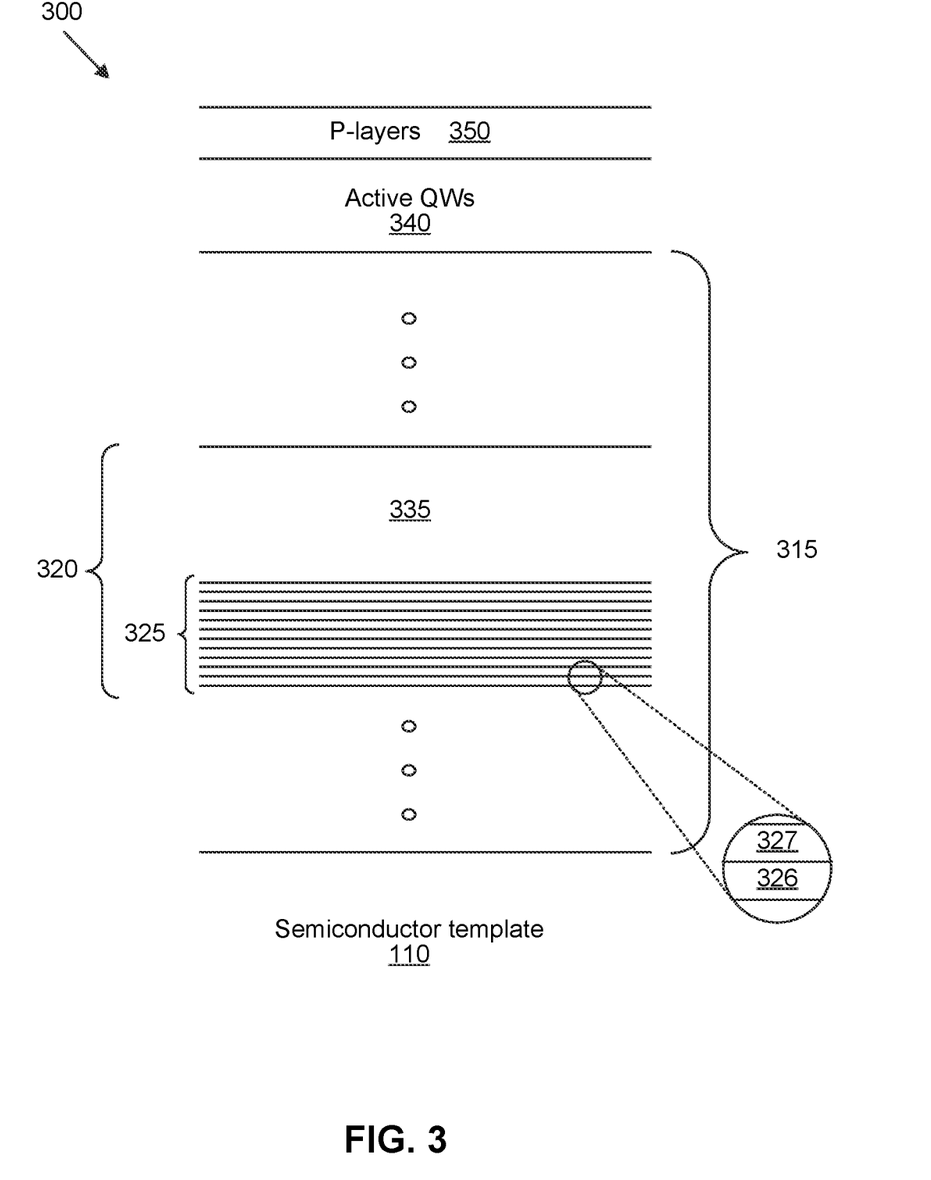
FIGS. 3 and 4 illustrate an example of an LED structure that uses a combination of SLS and bulk strain management layers, in accordance with aspects of this disclosure.

FIG. 3 shows an LED structure 300, which uses a combination of SLS and bulk strain management layers, in accordance with aspects of this disclosure. Like LED structures 100 and 200 shown on FIGS. 1 and 2, respectively, LED structure 300 is formed on a semiconductor template 110. LED structure 300 includes a strain management region 315 that is formed, grown (e.g., epitaxially grown), or deposited over semiconductor template 110.

Strain management region 315 may include one or more sets 320. In an example, each set 320 includes a first prep layer structure, such as an SLS 325 formed of a plurality of pairs of first and second layers 326 and 327, respectively, and a second prep layer structure, such as a bulk layer 335. It is noted that SLS structure 325 may include additional layers to first and second layers 326 and 327 to form a superlattice.

Strain management region 315 may include multiple sets of SLS structure 325 and bulk layer 335. For example, strain management region 315 may include two to fifty or more pairs of first and second layers 326 and 327. Further, strain management region 315 may further include one to tens of sets 320 of SLS 325 and bulk layer 335. Moreover, if multiple sets 320 are included within strain management region 315, the number of pairs within SLS structures 325 can be adjusted throughout sets 320 contained within strain management region 315.

Continuing to refer to FIG. 3, first and second layers 326 and 327 forming SLS structure 325 includes, for example, GaN and InGaN layers repeated to form a stack. Bulk layer 335 includes, for example, an In-containing layer such as InGaN, AlInN or AlInGaN, and is configured to provide improved surface morphology (e.g., reduction of pit formation) over using a superlattice alone as the strain management mechanism. According to the present disclosure, at least one of first layer 326, second layer 327, and bulk layer 335 may be an In-containing layer. In an example, one of first layer 326, second layer 327, and bulk layer 335 may include $In_xAl_yGa_{1-x-y}N$. In another example, one or more of first and second layers 326 and 327, respectively, and bulk layer 335 includes $In_xAl_yGa_{1-x-y}N$ with a respective composition, that is, the composition of each of these layers may be different from the composition of the other layers. For example, the composition of $In_xAl_yGa_{1-x-y}N$ for the bulk layer may be based on a value of x ranging from 0 to 0.15. The composition of $In_xAl_yGa_{1-x-y}N$ for the first layer within the SLS structure may be based on a value of x ranging from 0 to 0.3, and the composition of $In_xAl_yGa_{1-x-y}N$ for the second layer within the SLS structure may be based on a value of x ranging from 0 to 0.1.

As illustrated in FIG. 3, bulk layer 335 may have a larger thickness than the individual pairs (e.g., pairs of layers 326 and 327) within SLS structure 325. Bulk layer 335 may further include aspects described in connection with bulk layer 210 in FIG. 2. Active QWs 340 includes, for example, a multiple quantum well (MQW) structure configured to emit light during operation of LED structure 300. The light emitted can be an electromagnetic wavelength range, for example, in the visible spectrum. LED structure 300 also includes one or more p-layers 350 for providing electrical contact with LED structure 300.

As shown in FIG. 3, LED structure 300 is shown with SLS structure 325 in set 320 positioned under bulk layer 335, i.e., closer to the semiconductor template 110 than bulk layer 335 or farther from active QWs 340 than the bulk layer 335. However, the aspects presented herein may also be applied to the opposite order of the first layer and second layer within a set 320.

Figure 4:
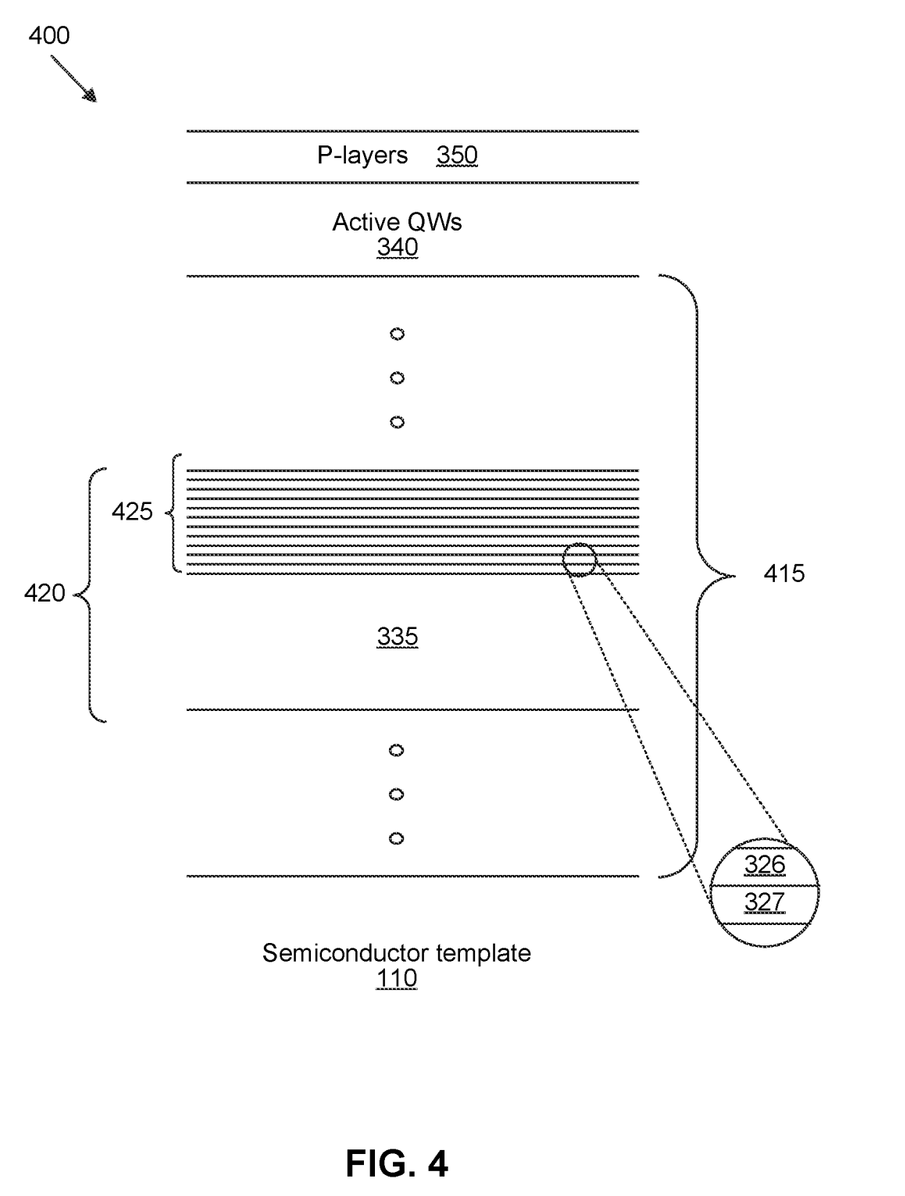

FIG. 4 illustrates an example LED structure 400, in which a strain management region 415 includes one or more sets 420 of bulk layer 335 and an SLS structure 425. In each set 420, SLS structure 425 is positioned over bulk layer 335, e.g., farther from semiconductor substrate 110 than bulk layer 335 within each set 420. Additionally, FIG. 4 illustrates that the order of first and second layers 326 and 327 within SLS structure 425 has been switched from SLS structure 325 of FIG. 3.

Figure 5:
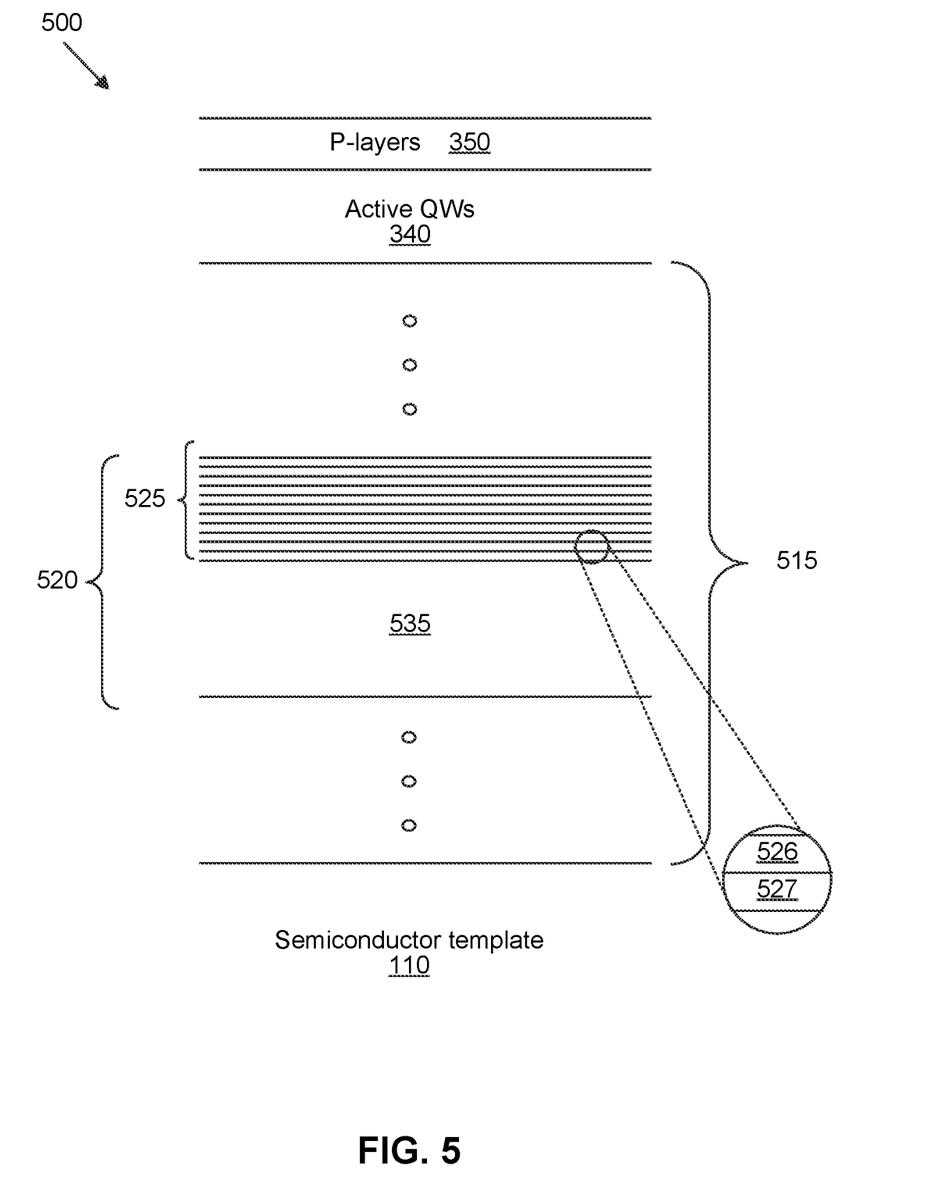
FIG. 5 illustrates an example of an LED structure including a UV superlattice structure, in accordance with aspects of this disclosure.

FIG. 5 illustrates an example LED structure 500, including a superlattice structure designed for producing light emission at a shorter wavelength than the active QW layers, if the superlattice were electrically addressed as an active region. As shown in FIG. 5, LED structure 500 includes semiconductor template 110 supporting a structure including active QWs 340 and p-layers 350, as in the structures illustrated in FIGS. 3 and 4. Additionally, LED structure 500 includes a strain management region 515 including a UV superlattice (UVSL) stack 520. UV SL stack 520 may include, for example, a bulk layer 335 and a UVSL structure 525. Bulk layer 535 may be formed of, for example, an InGaN layer. UVSL structure 525 includes, for instance, a first layer 526 and a second layer 527 that are repeated to form UVSL structure 525. As an example, UVSL structure 525 may be configured such that, if the layers were electrically addressed (i.e., an appropriate voltage or current were provided across UVSL structure 525), the layers would result in an electromagnetic wave emission in the ultraviolet (UV) wavelength range. For instance, first layer 526 may be a thin InGaN layer on the order of one nanometer in thickness, second layer 527 may be a slightly thicker GaN layer on the order of a few nanometers in thickness. First and second layers 526 and 527 may be repeated several times, such as five to ten times. However, UVSL structure 525 does not emit electromagnetic waves in the UV wavelength range because LED structure 500 is electrically addressed with the appropriate electrical input for producing light emission particularly from active QWs 340, not UVSL structure 525. That is, while LED structure 500 is configured for light emission from active QWs 340, and not UVSL structure 525, the presence of strain management region 515 promotes improved strain management, defect reduction, and surface characteristics of active QWs 340, thus resulting in improved light emission characteristics from active QWs 340 compared to had strain management region 515 had not been included within LED structure 500.

In an embodiment, UVSL stack 520, including UVSL structure 525 and bulk layer 535, may be repeated two or more times within strain management region 515. The In content of each of first layer 526, second layer 527, and/or bulk layer 535 may be tailored for desired material characteristics and light emission performance from active QWs 340. Additional layers, such as electron blocking layers, buffer or spacer layers, and other functional layers may be included in LED structure 500.

Figure 6:
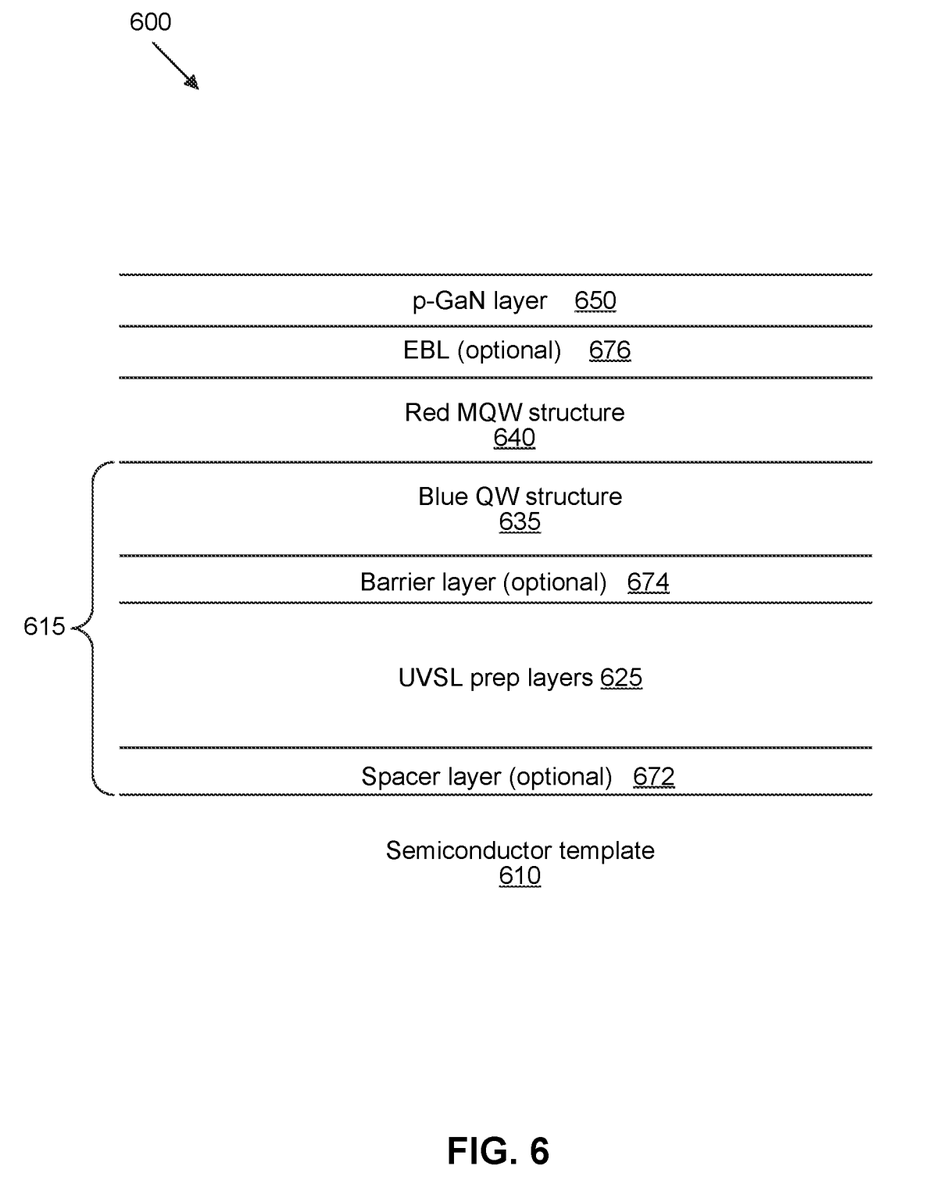
FIG. 6 illustrates an example of an LED structure including a non-emitting quantum well structure, in accordance with aspects of this disclosure.

FIG. 6 illustrates another exemplary LED structure. LED structure 600 includes a semiconductor template 610 formed of, as an example, n-GaN. LED structure 600 also includes a strain management region 615 formed on semiconductor template 610. Strain management region 615 includes, for example, UVSL prep layers 625 is formed on semiconductor template 610. UVSL prep layers 625 may include, for example, a combination of UVSL structure 525 and bulk layer 535 of FIG. 5 repeated two or more times within UVSL prep layers 625. Additionally, LED structure 600 includes a blue QW structure 635. Blue QW structure 635, in an example, is a multiple quantum well structure configured for light emission in a blue wavelength range, if blue QW structure 635 were electrically addressed with voltage or current particularly appropriate for blue light emission. LED structure 600 further includes a red multiple quantum well (MQW) structure 640, and finally a p-GaN layer 650 for providing electrical contact with LED structure 600.

Again, while LED structure 600 is configured for light emission from red MQW structure 640, and not UVSL 525 nor blue QW structure 635, the presence of strain management region 615 promotes improved strain management, defect reduction, and surface characteristics of red MQW structure 640, thus resulting in improved red light emission characteristics compared to had strain management region 615 had not been included within LED structure 600. While elements 625, 635, and 640 are described using specific wavelength descriptions such as UV, blue, and red, the important factor is that the design wavelengths of the super lattice and quantum well structures within the non-emitting, strain management region 615 are shorter than the intended emission wavelength from the active QW region, namely red MQW structure 640. For example, the use of UVSL 625 and blue QW structure 635 may also improve the light emission performance if red MQW region 640 were replaced with a multiple quantum well structure intended for light emission in an orange, yellow, or green wavelength range.

It is noted that additional interlayers, such as electron blocking layers, buffer or spacer layers, or other functional layers may be included within LED structure 600. For instance, LED structure 600 may optionally include a spacer layer 672 (formed, for example, of GaN), a barrier layer 674 (again formed, for example, of GaN), or an electron blocking layer 676 (formed, for example, of AlGaN). The inclusion of such additional layers may be selected for providing functionality such as reduced current leakage, improved containment of dopants within specific layers, improved surface characteristics, and reduced defects within the functional layers, particularly the active QW region.

The example implementations illustrated in FIGS. 3-6 are non-exclusive, and an LED structure may be based on any combination of aspects illustrated in FIGS. 3-6. Furthermore, additional layers not shown in FIGS. 3-6, such as interlayers, may also be included within LED structure 300, 400, 500, or 600 without deviating from the spirit of the present disclosure. For example, active QWs 340 of the implementations illustrated in FIGS. 3-6 may be formed directly adjacent to strain management region 315, 415, 515, or 615 while in other implementations there may be one or more layers formed between the strain management region and active QWs 340. For example, the additional layers described above with respect to LED structure 600 may be incorporated into any of LED structures 300, 400, and 500.

Figure 7:
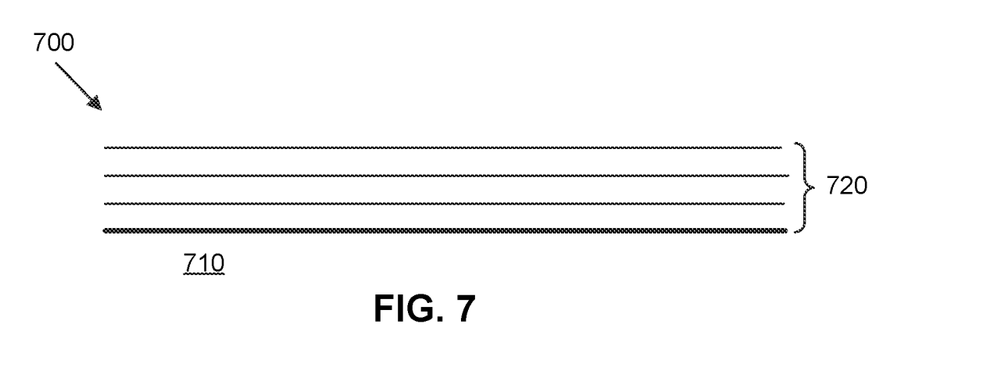
FIGS. 7-9 illustrate examples of LED structures with a combination of SLS and bulk strain management layers over a planar surface, a pedestal, or an area of a template defined by a mask, in accordance with aspects of this disclosure.
Figure 8:
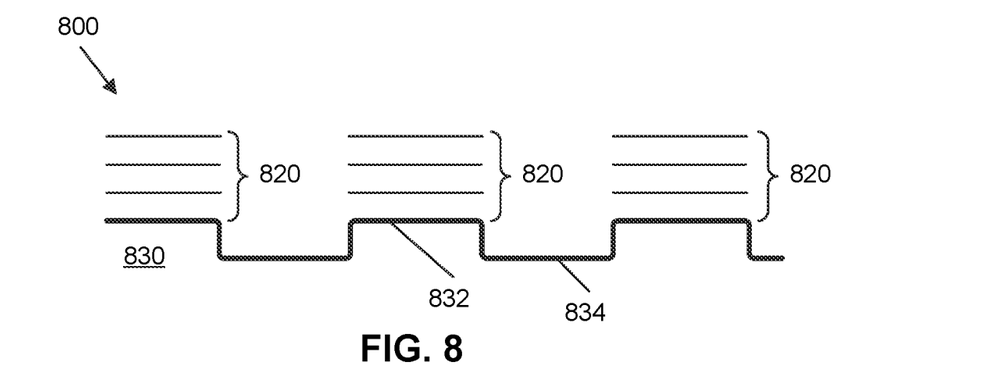
Figure 9:
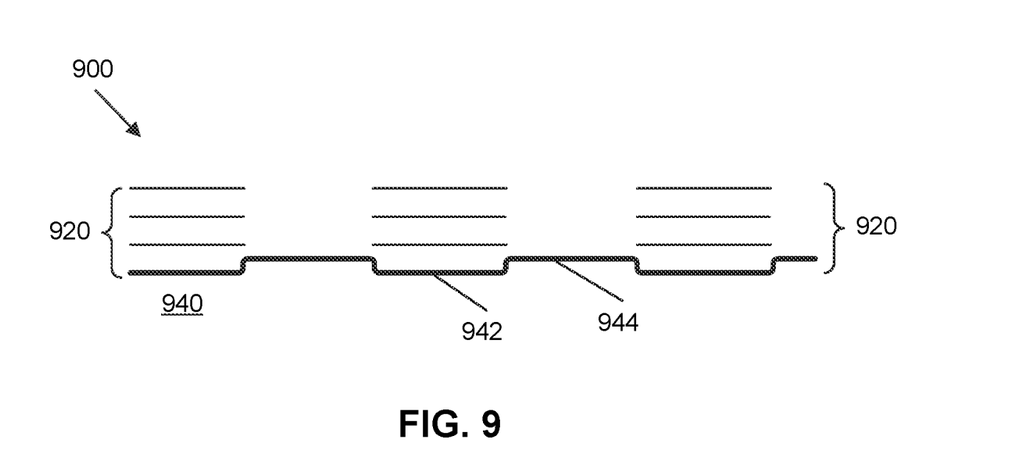

FIGS. 7-9 illustrate examples of LED structures with a combination of strain management regions formed as a planar device or an array of small LED devices, in accordance with aspects of this disclosure. For example, a planar LED structure 700 in FIG. 7 includes a planar substrate 710 on which a plurality of layers 720 is formed. Planar substrate 710 and layers 720 may include the same or similar configuration as LED structures 300, 400, 500, and 600 shown in FIGS. 3-6.

In another example, an array 800 in FIG. 8 includes a plurality of LED structures 820 formed on a patterned substrate 830. Patterned substrate 830 includes raised pedestal regions 832, on which LED structures 820 are formed, separated by lower trough regions 834. For example, one or more of LED structures 820 may be formed initially like LED structure 700 of FIG. 7, then an etch process can be used to separate the LED structure into separate LED structures 820. Lower trough regions 834 can serve to further electrically isolate adjacent LED structures 820, in an example, although lower trough regions 834 may optionally be eliminated such that array 800 of the plurality of LED structures 820 are formed on a planar substrate (e.g., planar substrate 710 of FIG. 7). Alternatively, pedestals 832 may first be formed on patterned substrate 830, then LED structures 820 can be formed on pedestals 832 by, for example, a masked deposition process. LED structures 820 may include the same or similar configuration as LED structures 300, 400, 500, and 600 shown in FIGS. 3-6.

In yet another example, an array 900 in FIG. 9 includes a plurality of LED structures 920 formed on a patterned substrate 940. Patterned substrate 940 includes lower, trough regions 942, in which LED structures 920 are formed, separated by raised regions 944. As an example, trough regions 942 may be first formed using a masked etch process, then LED structures 920 formed therein in a masked deposition process. LED structures 920 may include the same or similar configuration as LED structures 300, 400, 500, and 600 shown in FIGS. 3-6. As an example, trough regions 942 may have a diameter of one micron or less. In other examples, the trough regions may have a diameter greater than a micron. The specific sizes of the troughs are merely presented to illustrate the potential applications of the concepts presented herein and, again, the concepts described above may be applied to LED structures of any size.

The concepts presented herein may be applied to planar and shaped LED structures, even though only a portion of the LED structures are illustrated in FIGS. 3-9.

Figure 10:
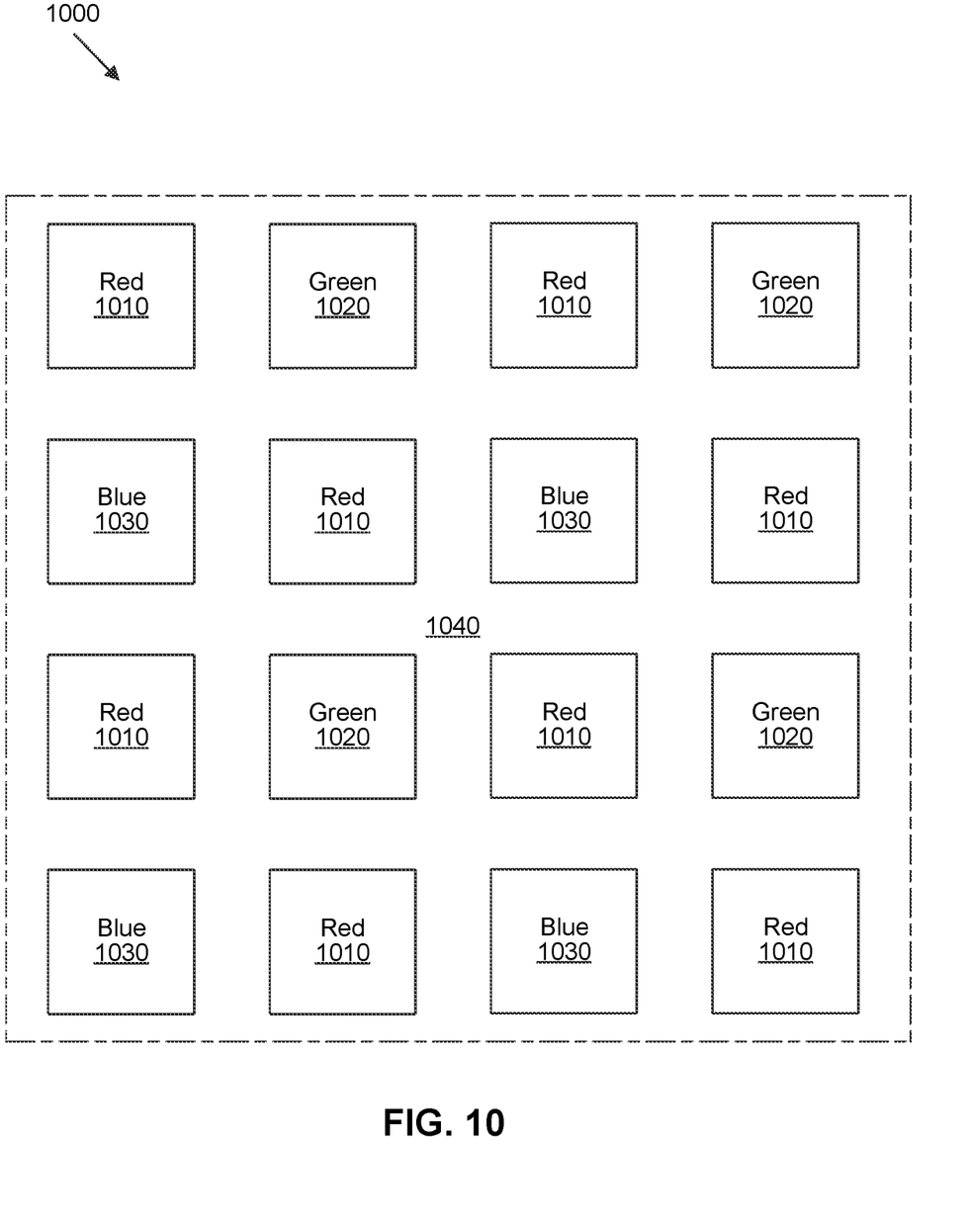
FIG. 10 illustrates a portion of an array of LED structures as part of a display, in accordance with aspects of this disclosure.

FIG. 10 shows a top view of an exemplary LED array 1000, in accordance with aspects of this disclosure. LED array 1000 includes a plurality of LED structures 1010, 1020, and 1030 emitting at red, green, and blue wavelengths, respectively, as an example, supported on a substrate 1040. The array may be part of a light emitting device that forms or is part of a display, for instance, and the arrangement of the pixels, their shapes, their numbers, their sizes, and their corresponding wavelength emissions can be adjusted for specific applications. As noted above, the display can be a high resolution, high density display, such as those used in light field applications. Any of LED structures 1010, 1020, and/or 1030, may be formed using aspects described in connection with FIGS. 3-9.

Figure 11:
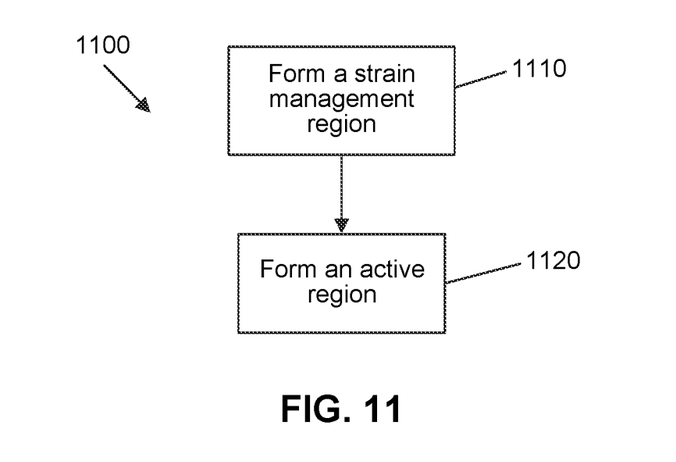
FIGS. 11 and 12 illustrate flow charts describing a method of fabricating an LED structure, in accordance with aspects of this disclosure.

FIG. 11 illustrates a simplified flow chart describing a method 1100 of fabricating an LED structure, in accordance with aspects of this disclosure. At step 1110, method 1100 includes forming a strain management region. Step 1110 may include aspects described in connection with FIGS. 3-9. At step 1120, method 1100 includes forming an active region configured to generate a light associated with the LED structure.

Figure 12:
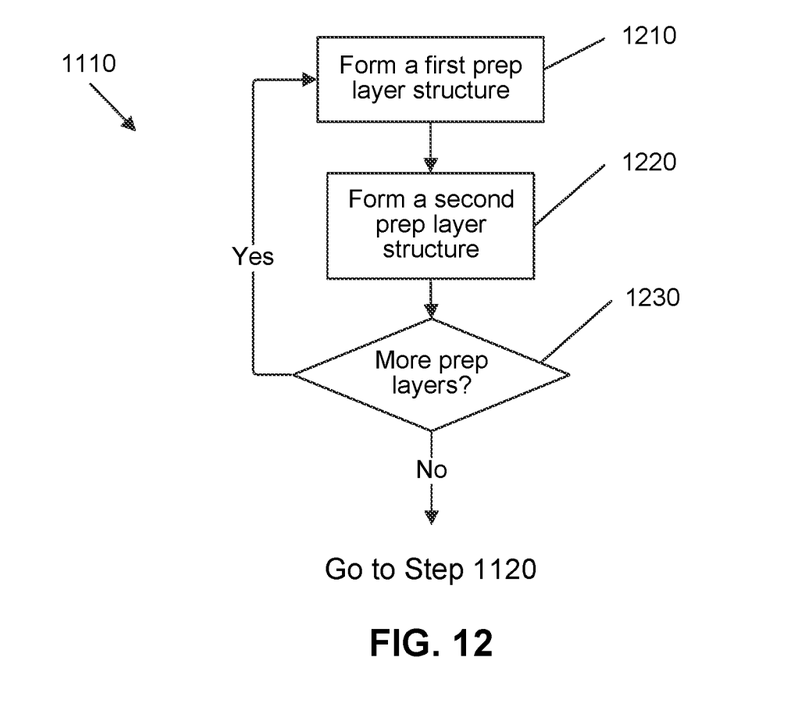

Further details of an exemplary embodiment of 1110 of method 1100 are illustrated in FIG. 12. As shown in the example illustrated in FIG. 12, in embodiments, step 1110 further includes forming a first prep layer structure in a step 1210. First prep layer structure includes, for instance, a superlattice structure (e.g., SLS structure 325) or a bulk layer (e.g., bulk layer 335) as described above. Step 1110 also includes forming a second prep layer structure in a step 1220. Second prep layer structure also includes, for instance, a superlattice structure (e.g., SLS structure 325) or a bulk layer (e.g., bulk layer 335). A decision 1230 is made to determine whether additional prep layers are desired for the specific LED structure being formed. If the answer to decision 1230 is YES, more prep layers are needed, then the process returns to 1210. If the answer to decision 1230 is NO, more prep layers are not needed, then process moves onto 1220 of method 1100 of FIG. 11.

The present disclosure describes various techniques and structures that enable the use of strain management structures within light emitting elements (e.g., LEDs) for improved light emissions performance from those light emitting elements.

Accordingly, although the present disclosure has been provided in accordance with the implementations shown, one of ordinary skill in the art will readily recognize that there could be variations to the embodiments and those variations would be within the scope of the present disclo-

What is claimed is:

1. A light-emitting diode (LED) structure formed on a substrate, the LED structure comprising:
   a strain management region supported on the substrate; and
   an active region configured to provide a light emission associated with the LED structure,
   wherein the strain management region includes a plurality of sets of layers,
     each set of layers from the plurality of sets of layers including:
       a first layer including a superlattice having a plurality of repeated first sublayers and second sublayers, and
       a second layer including a bulk layer.

2. The LED structure of claim 1, wherein the first layer is disposed adjacent to the substrate.

3. The LED structure of claim 1, wherein the second layer is disposed adjacent to the substrate.

4. The LED structure of claim 1, wherein at least one of the first sublayers and the second sublayers or the bulk layer includes a composition of $In_xAl_yGa_{1-x-y}N$.

5. The LED structure of claim 4, wherein the composition of $In_xAl_yGa_{1-x-y}N$ for the bulk layer is based on a value of x ranging from 0 to 0.15.

6. The LED structure of claim 4, wherein the composition of $In_xAl_yGa_{1-x-y}N$ for the first sublayers is based on a value of x ranging from 0 to 0.3.

7. The LED structure of claim 4, wherein the composition of $In_xAl_yGa_{1-x-y}N$ for the second sublayers is based on a value of x ranging from 0 to 0.1.

8. The LED structure of claim 1, wherein the active region includes at least one quantum well.

9. The LED structure of claim 1, wherein the light emission associated with the LED structure includes electromagnetic radiation in a visible wavelength range.

10. A light emitting device, comprising:
    a semiconductor template;
    an array of light emitting structures supported on the semiconductor template, at least one light emitting structure of the array of light emitting structures including:
      an active region configured to provide a light emission associated with the at least one light emitting structure; and
      a strain management region including:
        a first layer including a superlattice having a plurality of repeated first sublayers and second sublayers, and
        a second layer including a bulk layer,
    wherein at least one of the first sublayers and the second sublayers or the bulk layer of the strain management region of the at least one light emitting structure includes a composition of InAlGaN.

11. The light emitting device of claim 10, wherein the strain management region of the at least one light emitting structure includes a plurality of sets of alternating first and second layers.

12. A light-emitting diode (LED) structure formed on a substrate, the LED structure comprising:
    a strain management region supported on the substrate, the strain management region including a plurality of first layers alternating with a plurality of second layers each including a bulk layer, the plurality of first layers each including a superlattice having a plurality of repeated first sublayers and second sublayers; and
    an active region configured to provide a light emission associated with the LED structure.

13. The LED structure of claim 12, wherein one of the plurality of first layers is disposed adjacent to the substrate.

14. The LED structure of claim 12, wherein one of the plurality of second layers is disposed adjacent to the substrate.

15. The LED structure of claim 12, wherein at least one of the bulk layer or the first sublayers and the second sublayers includes a composition of $In_xAl_yGa_{1-x-y}N$.

16. The LED structure of claim 15, wherein the composition of $In_xAl_yGa_{1-x-y}N$ for the bulk layer is based on a value of x ranging from 0 to 0.15.

17. The LED structure of claim 15, wherein the composition of $In_xAl_yGa_{1-x-y}N$ for the first sublayers is based on a value of x ranging from 0 to 0.3.

18. The LED structure of claim 15, wherein the composition of $In_xAl_yGa_{1-x-y}N$ for the second sublayers is based on a value of x ranging from 0 to 0.1.

19. The LED structure of claim 12, wherein the active region includes at least one quantum well.

20. The LED structure of claim 12, wherein the light emission associated with the LED structure includes electromagnetic radiation in a visible wavelength range.

* * * * *